(12) United States Patent
Williams

(10) Patent No.: US 8,058,889 B2
(45) Date of Patent: Nov. 15, 2011

(54) PROBE CARD WITH SEGMENTED SUBSTRATE

(75) Inventor: Scott R. Williams, Saint George, UT (US)

(73) Assignee: SV Probe Pte. Ltd., Singapore (SG)

( * ) Notice: Subject to any disclaimer, the term of this patent is extended or adjusted under 35 U.S.C. 154(b) by 499 days.

(21) Appl. No.: 11/792,331

(22) PCT Filed: Nov. 30, 2005

(86) PCT No.: PCT/US2005/043294
§ 371 (c)(1),
(2), (4) Date: Apr. 3, 2009

(87) PCT Pub. No.: WO2006/060467
PCT Pub. Date: Jun. 8, 2006

(65) Prior Publication Data
US 2009/0212795 A1  Aug. 27, 2009

Related U.S. Application Data

(60) Provisional application No. 60/632,414, filed on Dec. 2, 2004.

(51) Int. Cl.
*G01R 31/00* (2006.01)
(52) U.S. Cl. .................................. 324/756.03
(58) Field of Classification Search .......... None
See application file for complete search history.

(56) References Cited

U.S. PATENT DOCUMENTS

| | | | | |
|---|---|---|---|---|
| 6,344,752 B1 * | 2/2002 | Hagihara et al. | | 324/754 |
| 6,784,678 B2 * | 8/2004 | Pietzschmann | | 324/758 |
| 7,217,580 B2 * | 5/2007 | Ondricek et al. | | 438/14 |
| 7,230,437 B2 * | 6/2007 | Eldridge et al. | | 324/754 |
| 7,271,602 B2 * | 9/2007 | Tunaboylu et al. | | 324/754 |
| 7,365,553 B2 * | 4/2008 | Garabedian et al. | | 324/758 |
| 7,471,094 B2 * | 12/2008 | Hobbs et al. | | 324/754 |
| 7,659,736 B2 * | 2/2010 | Eldridge et al. | | 324/754 |
| 7,772,863 B2 * | 8/2010 | Breinlinger et al. | | 324/760 |
| 2008/0246501 A1 * | 10/2008 | Williams et al. | | 324/762 |
| 2010/0134129 A1 * | 6/2010 | Breinlinger et al. | | 324/760 |

FOREIGN PATENT DOCUMENTS

JP  2002222839  8/2002
WO  WO 2006093704 A1 *  9/2006

OTHER PUBLICATIONS

Claims, international application No. PTC/US2005/043294, 3 pages.
International Searching Authority, "Written Opinion of the International Searching Authority", international application No. PTC/US2005/043294, dated Jun. 14, 2007, 8 pages.
European Patent Office, "Communication pursuant to Article 96(2) EPC", International application No. PTC/US2005/043294, Nov. 5, 2007, 8 pages.

* cited by examiner

*Primary Examiner* — Jermele M Hollington
(74) *Attorney, Agent, or Firm* — Hickman Palermo Truong & Becker LLP; Edward A. Becker

(57) ABSTRACT

A probe card for testing of semiconductor dice is provided. The probe card includes a mounting plate and a plurality of substrate segments supported by the mounting plate.

19 Claims, 11 Drawing Sheets

PROBE CARD WITH SEGMENTED SUBSTRATE

CROSS-REFERENCE TO RELATED APPLICATIONS

This application claims the benefit of U.S. Provisional Application No. 60/632,414, filed Dec. 2, 2004, the contents of which are incorporated herein by reference.

BACKGROUND OF THE INVENTION

The present invention relates to equipment for testing of integrated circuits. More particularly, the present invention relates to a probe card for wafer testing of semiconductor integrated circuits.

In semiconductor integrated circuit manufacturing, it is conventional to test the integrated circuits ("IC's") during manufacturing and prior to shipment to ensure proper operation. Wafer testing is a well-known testing technique commonly used in production testing of wafer-mounted semiconductor IC's (or "dice"), wherein a temporary electrical current is established between automatic test equipment (ATE) and each IC (or "die") on the wafer to demonstrate proper performance of the IC's. Exemplary components used in wafer testing include an ATE test board (e.g., a multilayer printed circuit board that is connected to the ATE) that transfers the test signals back and forth between the ATE and a probe card.

An exemplary probe card includes a printed circuit board that generally contains several hundred probe needles positioned to establish electrical contact with a series of connection terminals (or die contacts) on the IC wafer. Known probe cards may also include a substrate or so-called space transformer which electrically connects the probes to the printed circuit board. The space transformer may include a multi-layer ceramic substrate, a multi-layer organic substrate, etc. It is known to mount each of the plurality of flexible probes to a mounting surface of the space transformer. Typically, the probes are mounted to electrically conductive, preferably metallic bonding pads formed on the substrate though conventional plating or etching techniques well known to those of ordinary skill in the art of semiconductor fabrication.

One difficulty in the fabrication of probe cards is that the mounting surface of the space transformer substrate is desirably maintained within a tight flatness tolerance, such that undesirable variation in the positions of the probe tips, which connect with the IC connection terminals, is minimized. Tight positional tolerances of all the probe tips within the probe assembly are crucial for establishing and maintaining identical contacting conditions between the individual probe tips and the terminals of the tested chips. Positional tolerances affect both the position of the probe tips relative to the corresponding terminals and the force required to establish a satisfactory electrical connection between the probes and the IC connection terminals. In order to tightly control positional tolerances of the probe tips, it is desirable that the mounting surface of the plurality of probes be as nearly planar as practicable.

A large probe card is desirable in that a larger probe card can accommodate concurrent testing of a larger number of semiconductor dice or testing of a larger single semiconductor die, and thus increase the efficiency of the testing process. However, as the size of the probe card and the substrate increases, it becomes increasingly difficult to efficiently produce substrates having satisfactory flatness characteristics. For example, as the substrate material is lapped to a desired configuration, residual stresses can be created or relieved. Changes in the stress state of the substrate material can in turn cause warpage of the substrate, which tends to result in larger magnitude flatness deviations as the size of the substrate increases. Furthermore, a non-repairable defect in a relatively large substrate work piece results in more waste, and thus less efficiency, than would occur in a production process having the same defect rate and producing relatively small substrate work pieces. Still further, as the size of the probe card and substrate increases, variation in position of the probe tips from a desired nominal position also increases as the substrate is exposed to temperature variations and undergoes expansion and contraction in accordance with the substrate material's coefficient of thermal expansion properties.

Thus, it would be desirable to provide a probe card and substrate combining relatively large size with satisfactory flatness characteristics, good manufacturing characteristics, and capable of maintaining satisfactory positional tolerances over the expected operating temperature range of the probe card.

BRIEF SUMMARY OF THE INVENTION

According to an exemplary embodiment of the present invention, a probe card for testing of semiconductor dice is provided. The probe card includes a mounting plate and a plurality of substrate segments supported by the mounting plate.

According to another exemplary embodiment of the present invention, a probe card is provided. The probe card includes a printed circuit board including a plurality of conductive pads. The probe card also includes a probe substrate supporting a plurality of probe elements. The probe elements are conductively coupled to respective ones of the plurality of conductive pads. The probe substrate includes a plurality of substrate segments.

BRIEF DESCRIPTION OF THE DRAWINGS

For the purpose of illustrating the invention, there are shown in the drawings a form of the invention which is presently preferred; it being understood, however, that this invention is not limited to the precise arrangements and instrumentalities shown. In the drawings:

FIG. 1A is an enlarged detail view of a semiconductor die of the semiconductor wafer of FIG. 1;

DETAILED DESCRIPTION OF THE INVENTION

According to an exemplary embodiment of the present invention, a probe card for testing of semiconductor dice is provided. The probe card includes a mounting plate and a plurality of substrate segments coupled to the mounting plate by a frame. For example, the frame includes at least one biasing member to bias each substrate segment into a first position relative to the frame and to elastically accommodate thermal expansion and contraction of the substrate segments. Further, the frame may be fabricated from a material having a low coefficient of thermal expansion.

Figure 1:
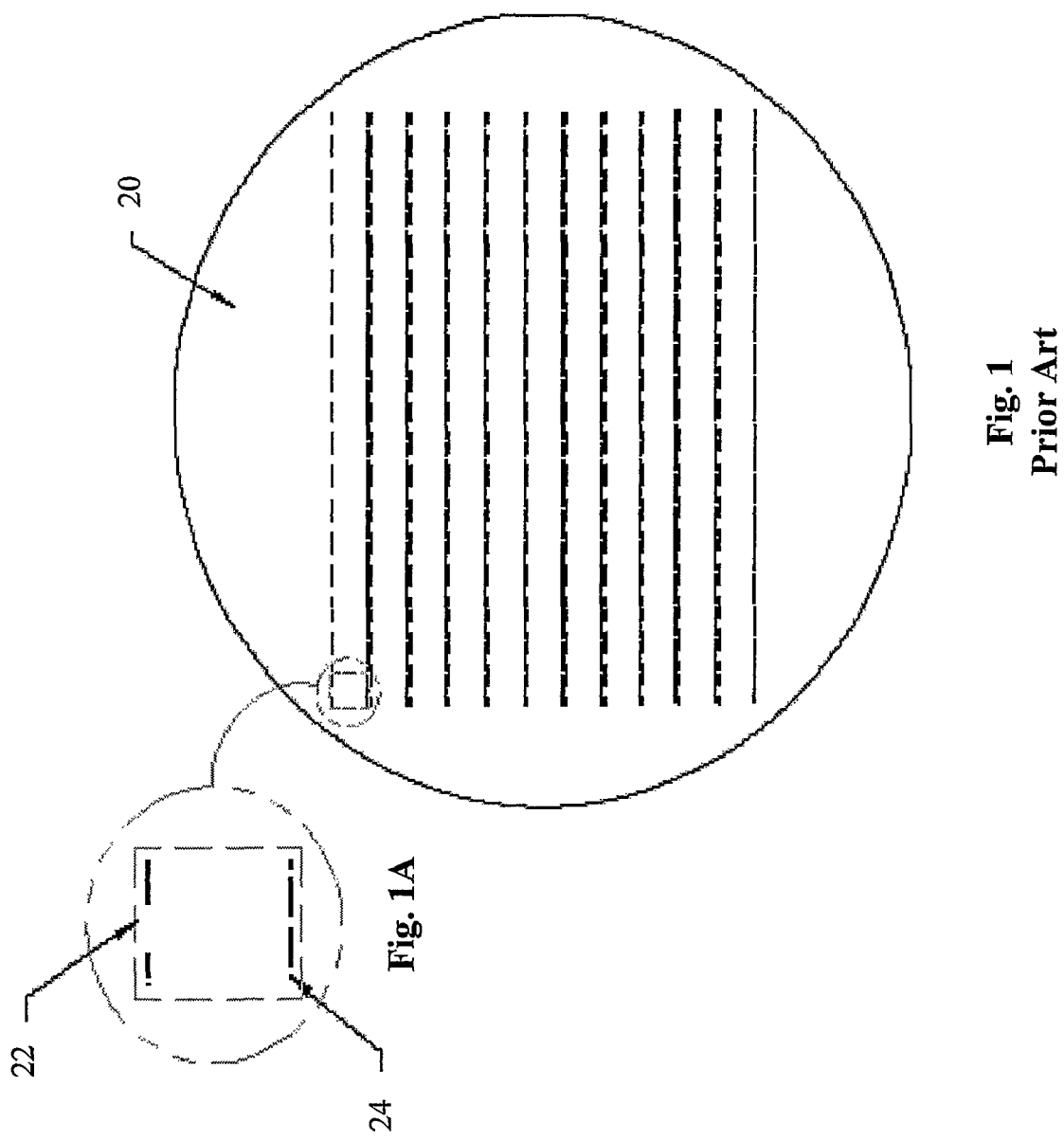
FIG. 1 is a plan view of a prior art semiconductor wafer containing a plurality of semiconductor dice.
Figure 2:
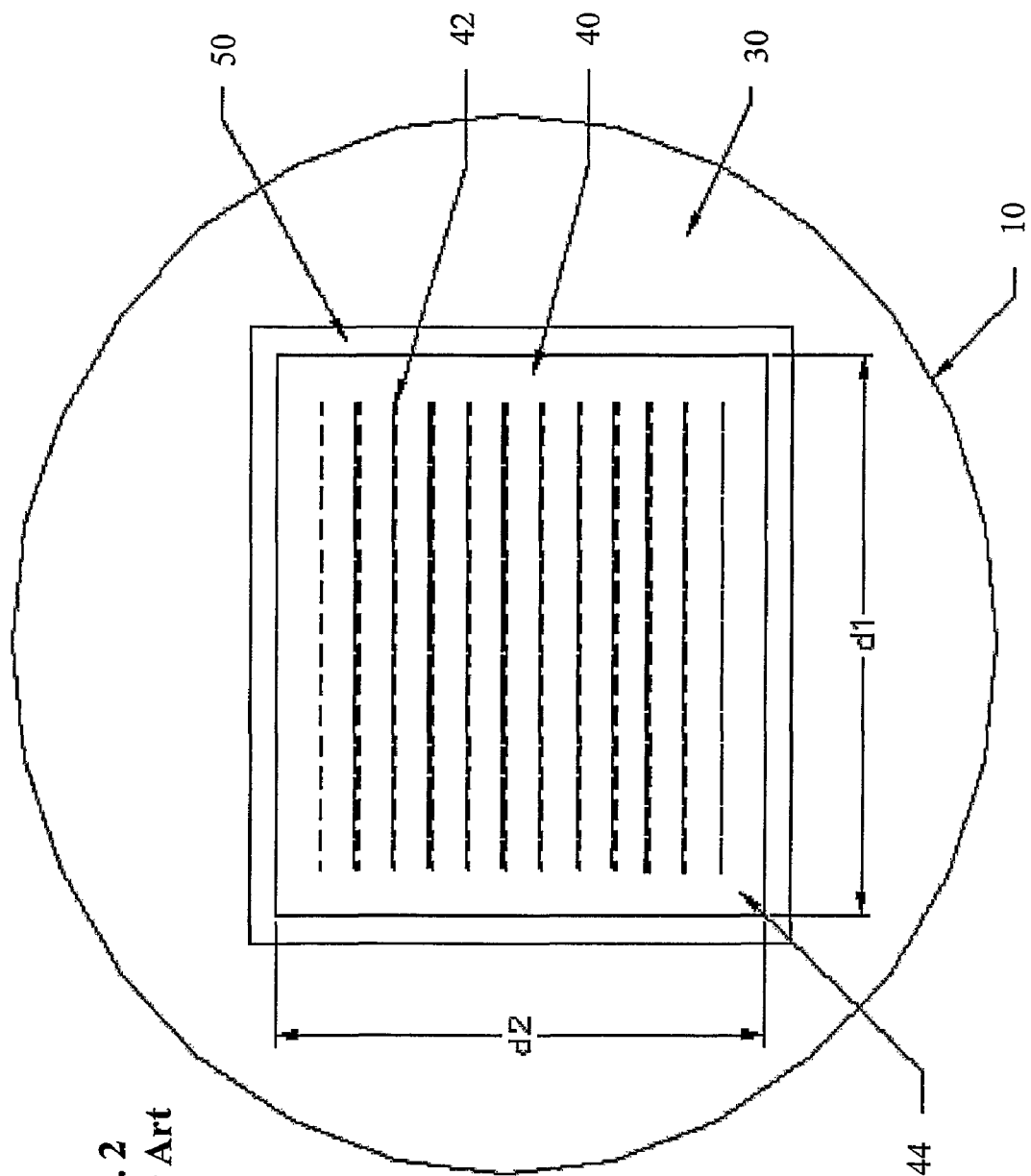
FIG. 2 is a schematic plan view of a portion of a prior art probe card, showing an upper surface of a substrate coupled to a mounting plate by a frame.
Figure 3:
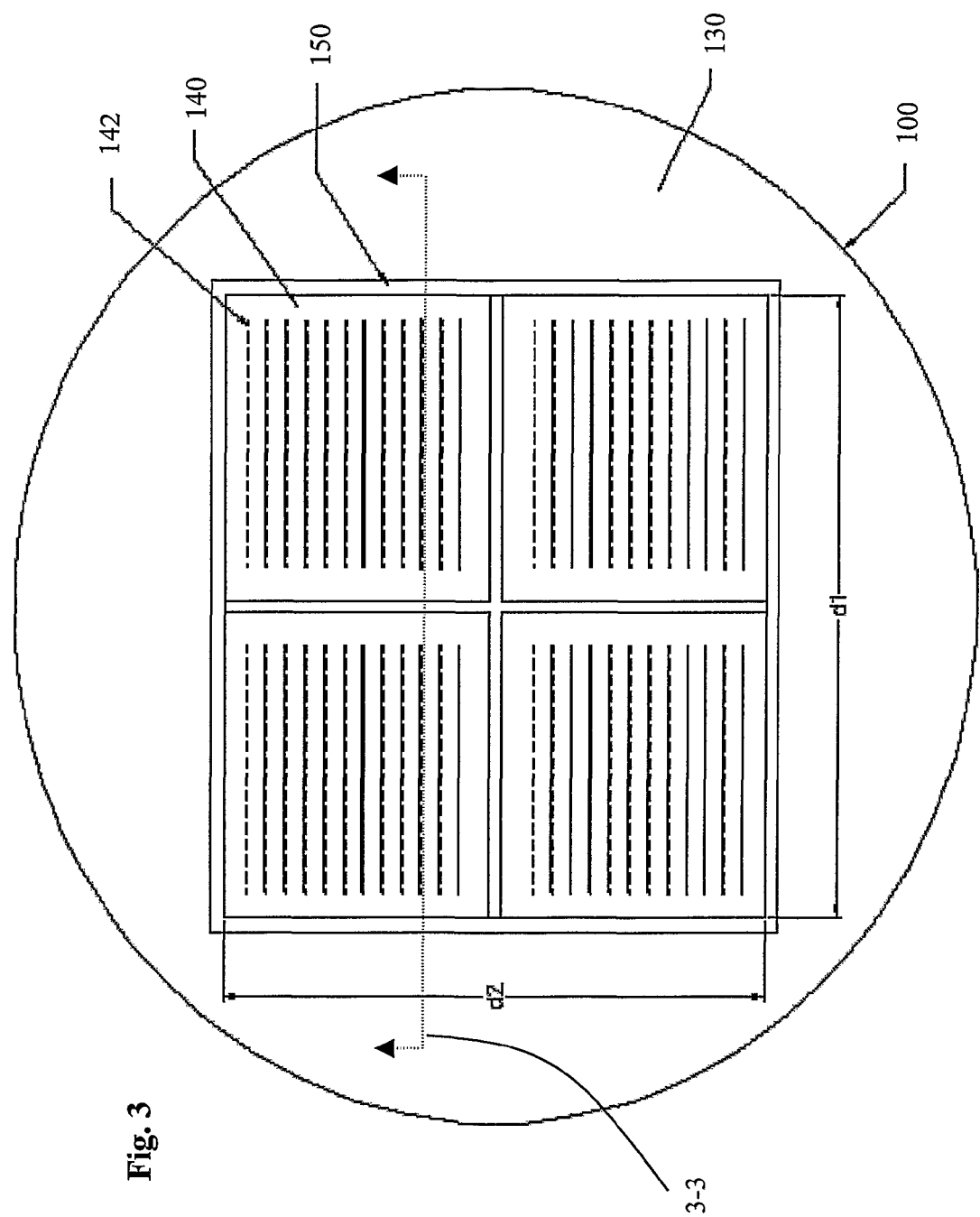
FIG. 3 is a schematic plan view of a portion of a probe card in accordance with an exemplary embodiment of the present invention.
Figure 4:
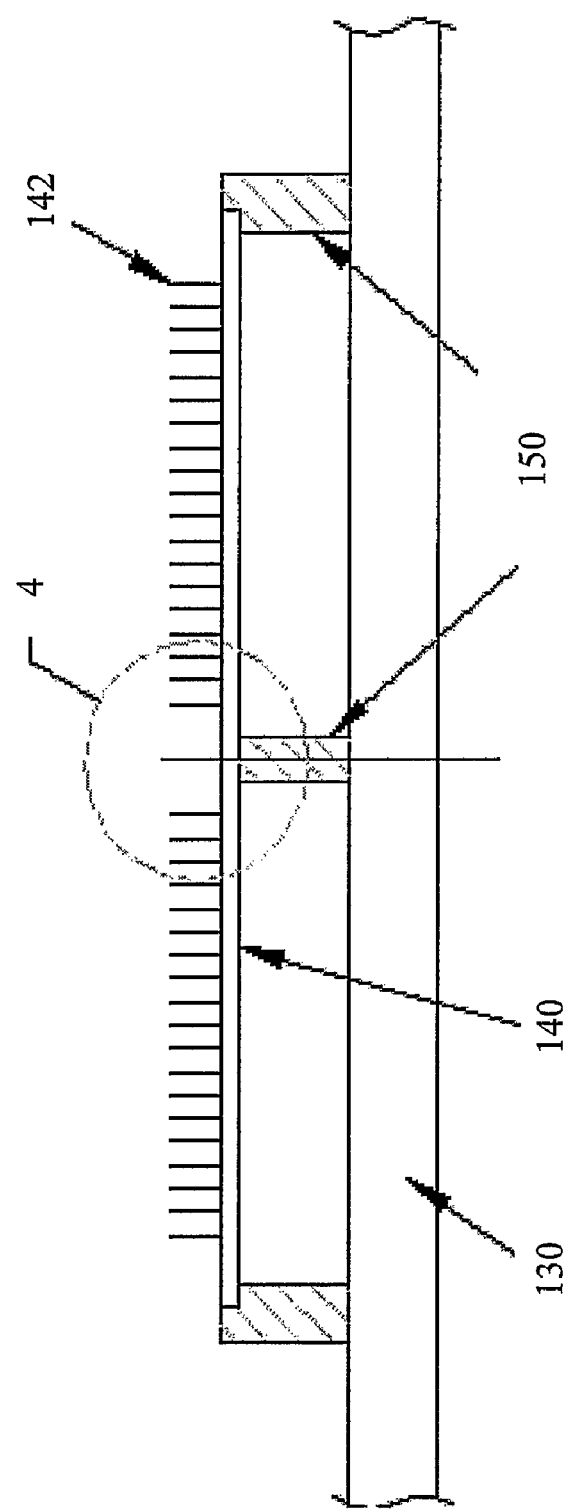
FIG. 4 is a schematic cross-sectional view of the probe card of FIG. 3, showing an assembly of substrate segments installed in a frame, taken along line 3-3 of FIG. 3.
Figure 5:
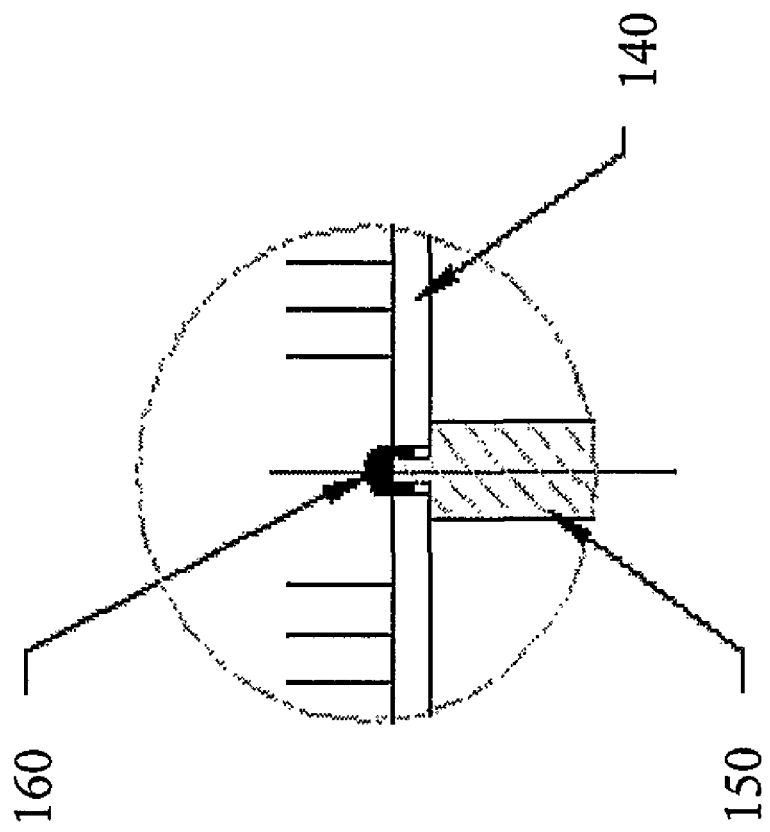
FIG. 5 is an enlarged detail view of the frame of FIGS. 3 and 4 shown with compliant epoxy used to position the substrate segments within the frame.

Referring to the drawings, and initially to FIGS. 1, 1A, and 2, it is known in the prior art to provide probe card 10 adapted for use in testing of semiconductor wafers 20 having a plurality of semiconductor dice 22. Each semiconductor die 22 is provided with multiple die contacts 24 (while a small number of contacts are shown in FIG. 1A, it is understood that any number of die contacts may be included on die 22). Prior art probe card 10 comprises mounting plate 30 and substrate 40 coupled to mounting plate 30 by frame 50. In the art of wafer testing, substrate 40 may also be referred to, for example, as a "space transformer". Mounting plate 30 may be, for example, a printed circuit board in electrical communication with substrate 40.

While in certain figures described herein the substrate (e.g., substrate 40) is shown as being of a relatively large size compared to the corresponding mounting plate and/or PCB (e.g., mounting plate 30), it is understood that this is for clarity of illustration. It is understood that the respective sizes of the illustrated components is not relevant to the invention, and that in certain probe cards the substrate (e.g., a space transformer) is significantly smaller than the PCB.

A plurality of probes 42 are mounted to substrate 40 on mounting surface 44. Probes 42 are fabricated, for example, from an electrically conductive metal, such as aluminum or copper. During testing of semiconductor wafer 20, relative movement between wafer 20 and probe card 10 causes electrical contact between tips of probes 42 with die contacts 24 of semiconductor die 22 undergoing testing. It is important that the tips of probes 42 be positioned very precisely relative to one another to ensure proper operation of probe card 10 during the wafer testing procedure.

Substrate 40 may comprise, for example, a multi-layer ceramic material, a multi-layer organic material, etc. Substrate 40 has a width d1 and a length d2. Mounting surface 44 in such prior art substrates is subject to waviness that may result from either the process of manufacturing substrate 40 or subsequent processing of substrate 40. If probes 42 are mounted to a non-planar mounting surface 44, that waviness in mounting surface 44 tends to decrease the precision with which the probe tips are positioned relative to die contacts 24. The magnitude of waviness tends to be a function of the overall size of substrate 40. If, for example, a residual stress in substrate 40 tends to cause a deflection of 0.5 degrees along a central axis of substrate 40, then the distance by which mounting surface 44 is moved out of an ideal planar position increases with distance from the central axis.

Probes 42 are typically able to accommodate only a limited degree of deflection before being damaged. Thus, as the probe card size increases, the substrate waviness which is desirably accommodated by deflection of probes 42 typically also increases, conceivably to a point where the waviness which is desirably accommodated exceeds the level of deflection which probes 42 can accommodate. Additionally, as the size of substrate 40 increases, the amount of waste also increases since substrates 40 falling outside manufacturing tolerances are typically discarded.

In addition to waviness of mounting surface 44, differential thermal expansion between substrate 40 and semiconductor wafer 20 can also lead to inaccurate positioning of the probe tips relative to die contacts 24. The maximum displacement of a probe tip from its desired nominal position due to differential thermal expansion tends to increase as the size of substrate 40 increases, for example, because the wafers typically comprise silicon and the substrates often comprise materials such as ceramic materials. Such silicon and ceramic materials have different thermal expansion characteristics, and as the size of substrate 40 increases, the total differential thermal expansion of substrate 40 relative to wafer 20 also increases.

With reference now to FIGS. 3-6, in view of the problems associated with increases in substrate size, while also recognizing the benefit of increased testing capability and efficiency resulting from providing larger substrates, according to an exemplary embodiment of the present invention, probe card 100 is provided for testing of semiconductor dice 22, comprising mounting plate 130 and plurality of substrate segments 140 supported by (e.g., coupled to) mounting plate 130 by frame 150. Mounting plate 130 may be similar to the prior art mounting plate 30. When assembled in frame 150, the plurality of substrate segments 140 (supporting probes 142) have a combined width d1 and length d2 which may be equal to width d1 and length d2 of prior art substrate 40. The plurality of substrate segments 140 may operate generally similarly to prior art substrate 40, however, the individual substrate segments 140 may be significantly smaller in width and length than prior art substrate 40.

Frame 150 desirably functions to accurately position each of substrate segments 140 within probe card 100 over a broad range of temperatures. For example, frame 150 is fabricated from a material having a relatively low (for example, equal to or less than about $2.5*10^{-6}$ inch/inch/Fahrenheit degree (about $4.5*10-6$ cm/cm/Celsius degree)) coefficient of thermal expansion (CTE), to generally match the relatively low CTE of the ceramic substrate (e.g., about $3.3*10^{-6}$ inch/inch/Fahrenheit degree (about $6.0*10-6$ cm/cm/Celsius degree)). Exemplary materials having the desired characteristic include metals such as steel having varying compositions of nickel, with specific examples being sold under the trademarks INVAR and NILO. Additional exemplary materials include molybdenum, molybdenum alloys, and stainless steel. While frame 150 material may be chosen to have a CTE which generally matches that of substrate 140, there is some differential thermal growth between frame 150 and substrate 140 during the testing process. Thus, frame 150 desirably functions to accurately position substrate segments 140 while also accommodating differential thermal growth between frame 150 and substrate segments 140.

This function may be accomplished in a variety of ways. For example, with particular reference to FIG. 5, compliant epoxy 160 suitable for use at the maximum processing temperatures can be used to pot substrates 140 into frame 150. Compliant epoxy 160 operates to bias each substrate segment 140 into a first position relative to frame 150 and to elastically accommodate thermal expansion and contraction of substrate segments 140.

Figure 6:
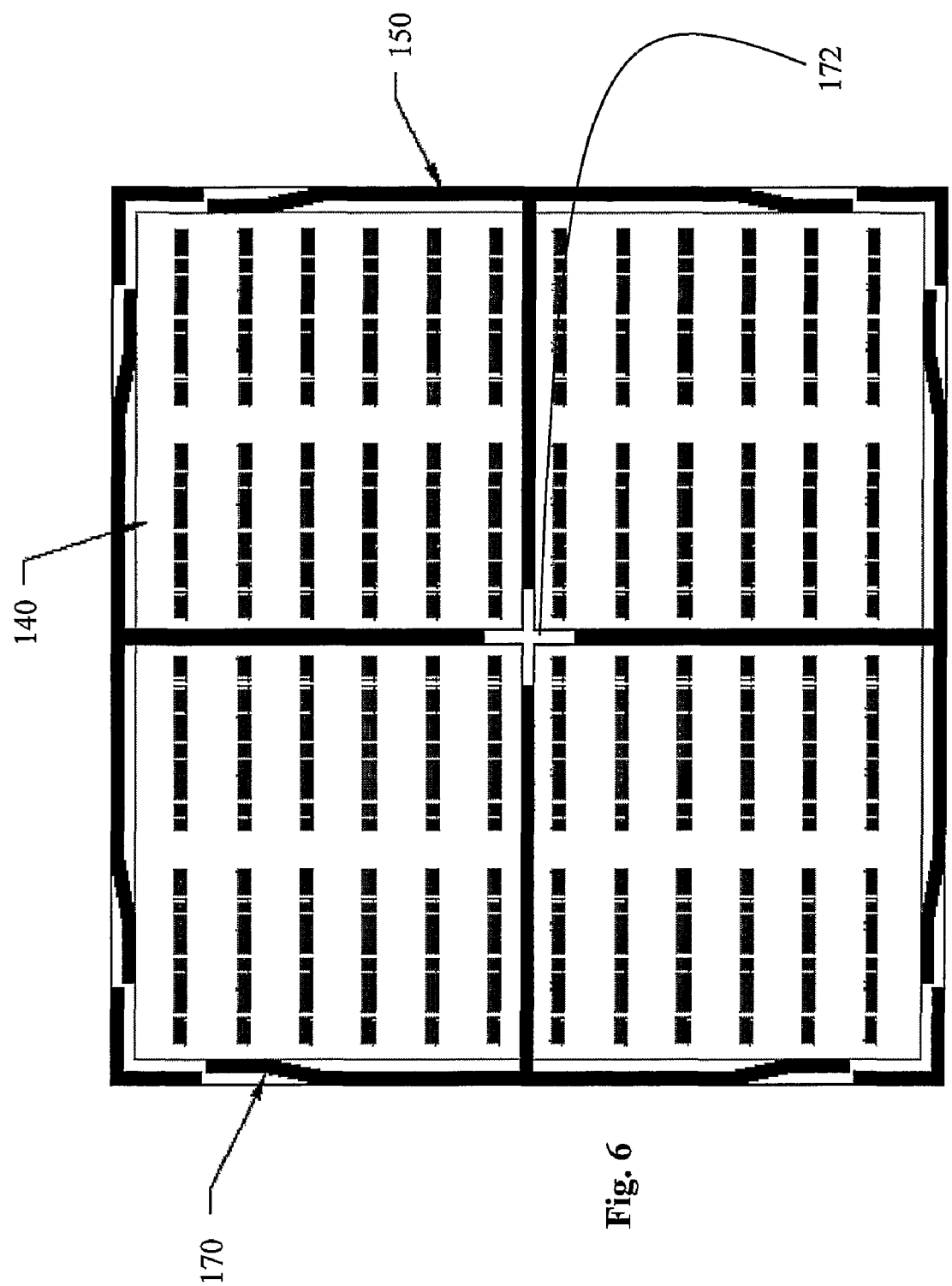
FIG. 6 is a schematic top plan view of the frame of FIGS. 3 and 4 shown with spring biasing members used to position the substrate segments within the frame.

According to another exemplary embodiment of the present invention, with reference to FIG. 6, frame 150 can include spring elements 170 which also operate to bias each substrate segment 140 into a first position relative to frame 150 and to elastically accommodate thermal expansion and contraction of substrate segments 140. For example, spring elements 170 may be configured to bias each substrate segment 140 towards center portion 172 of mounting plate 150.

Figure 7:
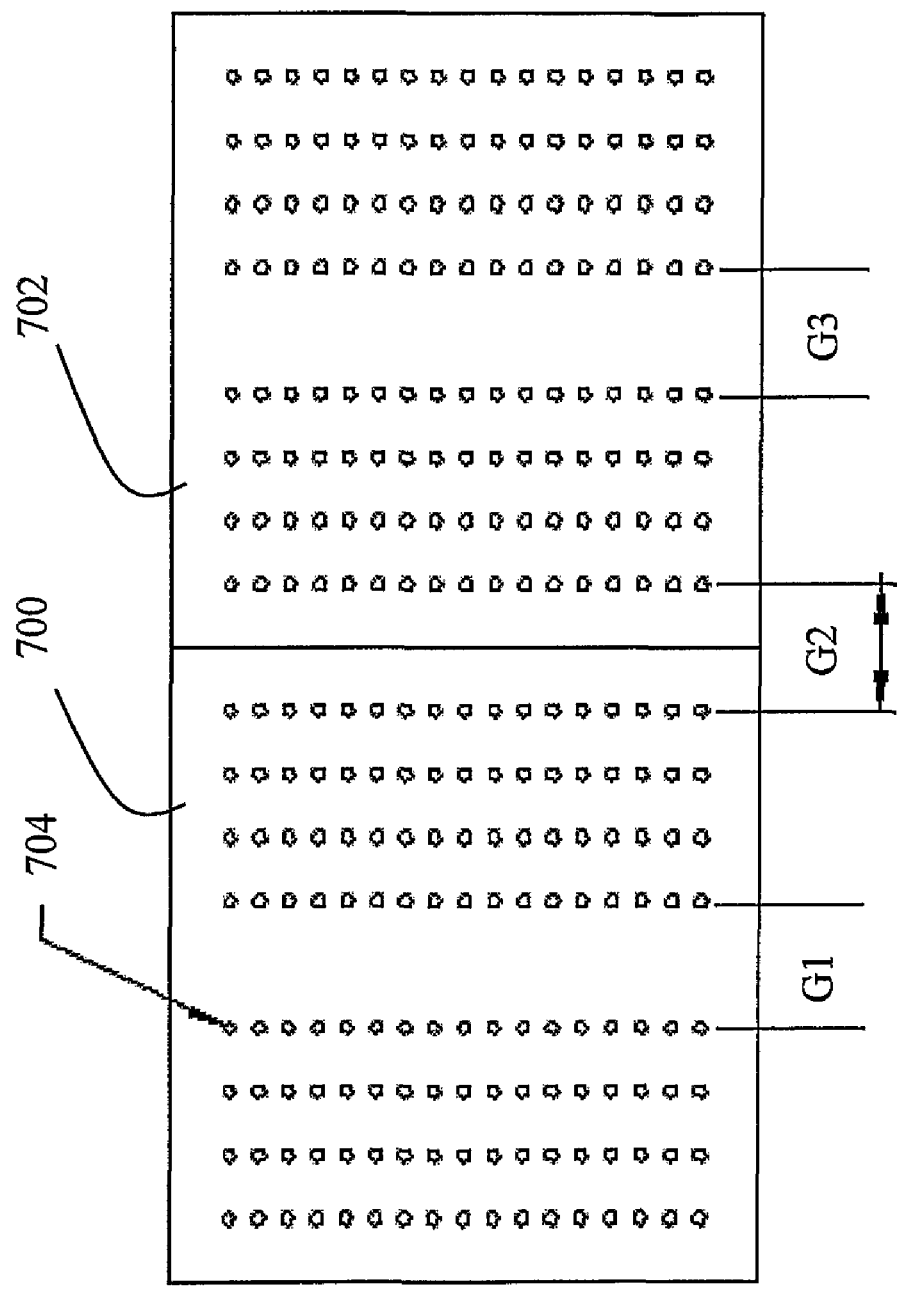
FIG. 7 is a top view of two adjacent substrate segments according to an exemplary embodiment of the present invention.

FIG. 7 illustrates two adjacent substrate segments 700 and 702 according to an exemplary embodiment of the present invention. According to the present invention, it may be desirable to align probes 704 on the substrate segments in a configuration to match the die contact locations on a wafer to be tested. More specifically, it may be desirable to contact as many die contacts of the wafer as is practical, thereby improving the testing cycle. As shown in FIG. 7, each of substrate segment 700 and 702 includes 8 rows of probes. On substrate segment 700, gap G1 separates the left group of probes (4 rows) from the right group of probes (4 rows). Likewise, on substrate segment 702, gap G3 separates the left group of probes (4 rows) from the right group of probes (4 rows). Further, probes 704 are arranged on substrate segments 700 and 702 such that gap G2 exists between the right hand group of probes of substrate segment 700 (4 rows) and the left hand group of probes of substrate segment 702 (4 rows). Gap G2 is desirably configured to be substantially similar to gaps G1 and G3. Of course, this methodology (optimizing probe layout on adjacent substrate segment) may be applied to any number of substrate segments in a given configuration.

Various different support configurations are contemplated for supporting the substrate segments. FIGS. 8-11 illustrate 4 exemplary configurations. While FIGS. 8-11 illustrate only two substrate segments, it is clear that varying numbers of substrate segments are contemplated.

Figure 8:
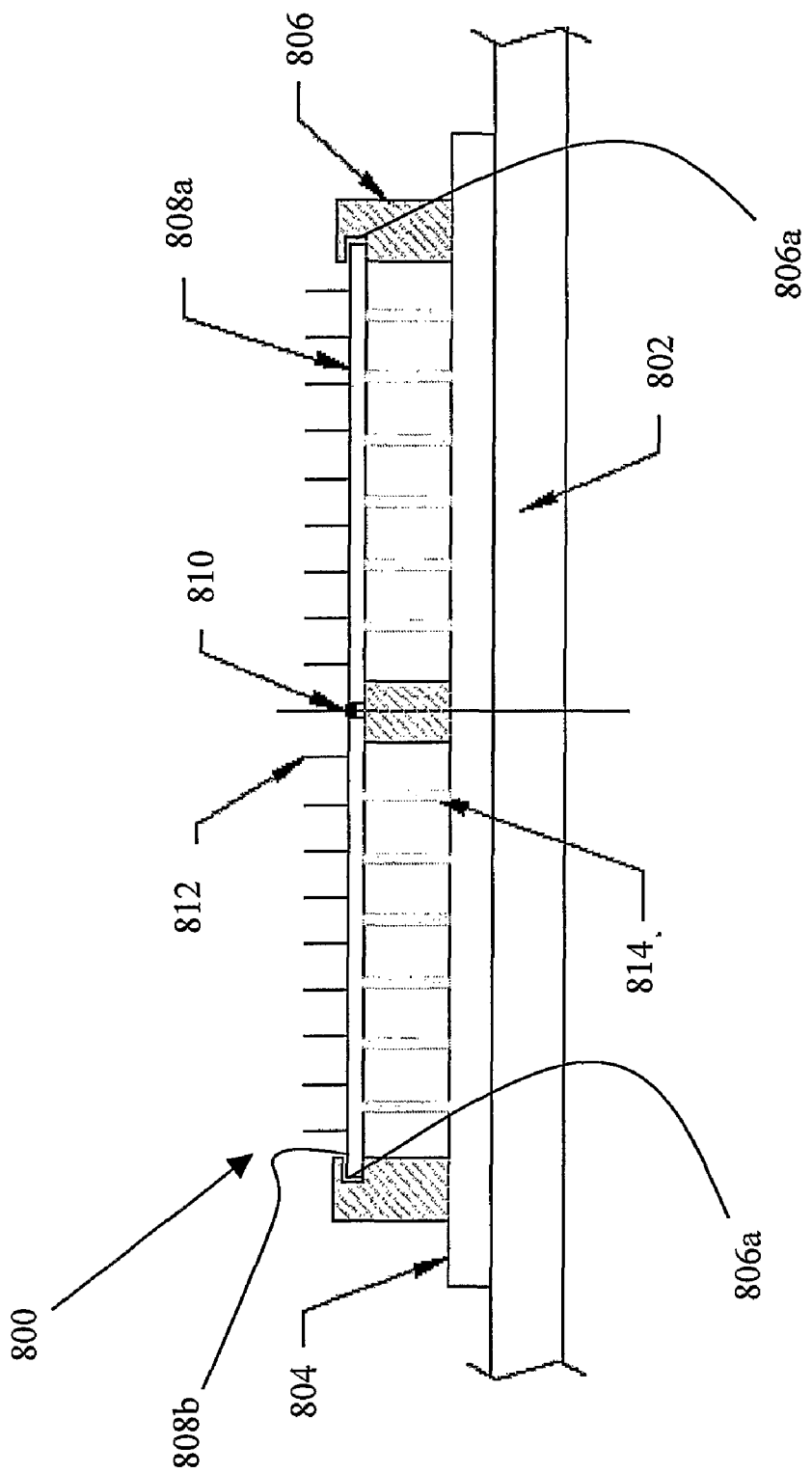
FIG. 8 is a schematic cross-sectional view of a probe card according to an exemplary embodiment of the present invention.

FIG. 8 illustrates probe card 800 including PCB 802, mounting plate 804, and frame 806. Frame 806 supports substrate segments 808a and 808b, and substrate segments 808a and 808b support probe elements 812. Epoxy 810 is provided between substrate segments 808a and 808b. Interposer 814 (e.g., a spring pin interposer, a pogo pin interposer, a planar contact array interposer, etc.) is provided between mounting plate 804 and substrate segments 808a/808b, and may comprise a number of interposers. Thus, electrical paths are provided from PCB 802, through mounting plate 804, through interposer 814, through substrate segments 808a and 808b, and to probes 812.

Frame 806 defines notches 806a for engagement with an edge portion of substrate segments 808a and 808b.

Figure 9:
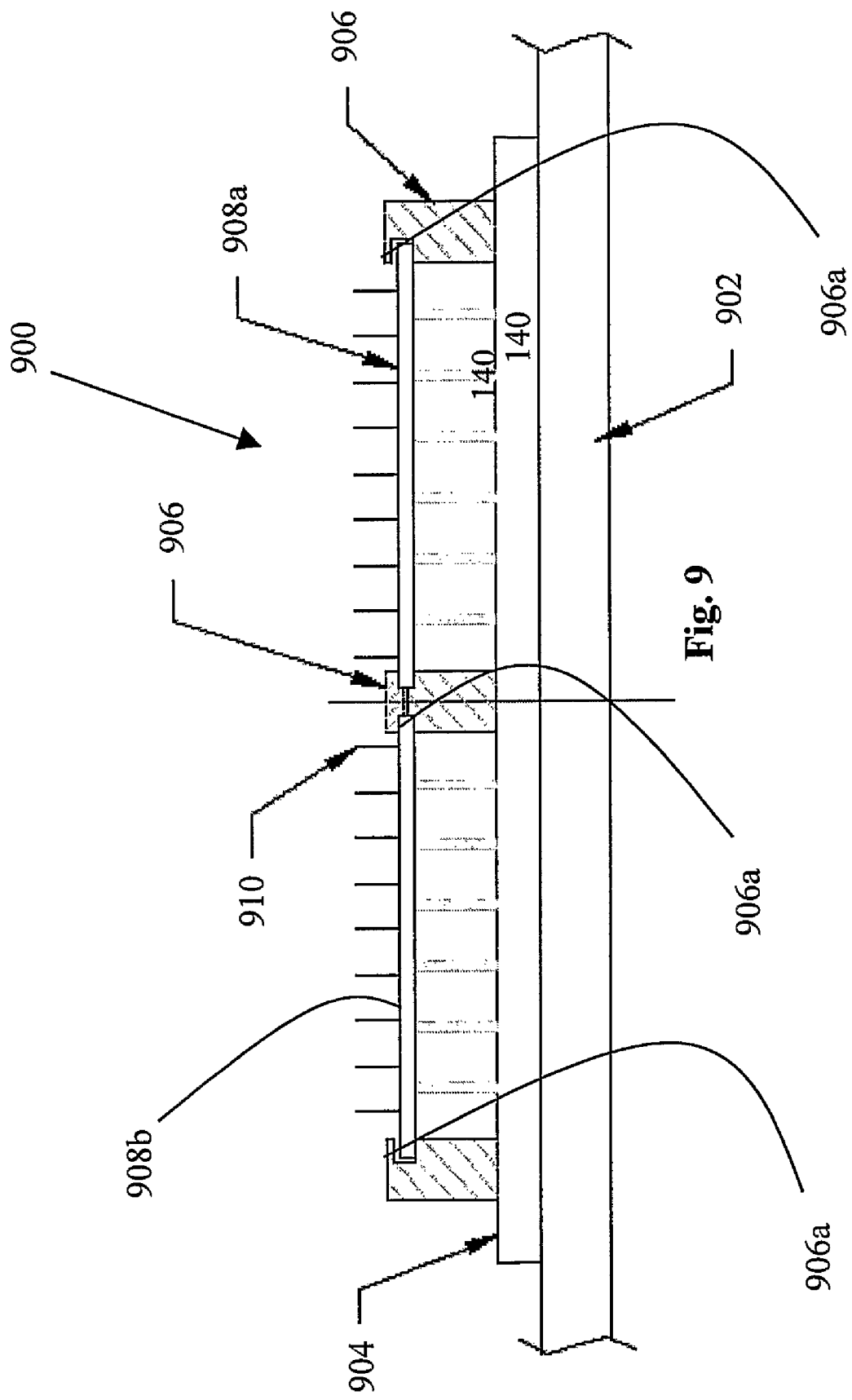
FIG. 9 is a schematic cross-sectional view of another probe card according to an exemplary embodiment of the present invention.

FIG. 9 illustrates probe card 900 including PCB 902, mounting plate 904, and frame 906. Frame 906 supports substrate segments 908a and 908b, and substrate segments 908a and 908b support probe elements 910. Interposer 914 (e.g., a spring pin interposer, a pogo pin interposer, a planar contact array interposer, etc.) is provided between mounting plate 904 and substrate segments 908a/908b, and may comprise a number of interposers.

Frame 906 defines notches 906a for engagement with an edge portion of substrate segments 908a and 908b.

In certain configurations, the notched-frame configuration shown in FIGS. 8-9 is not practical. For example, the probe elements supported by the substrate segments may be of a height (above the surface of the substrate segments) that can not accommodate such a configuration.

Figure 10:
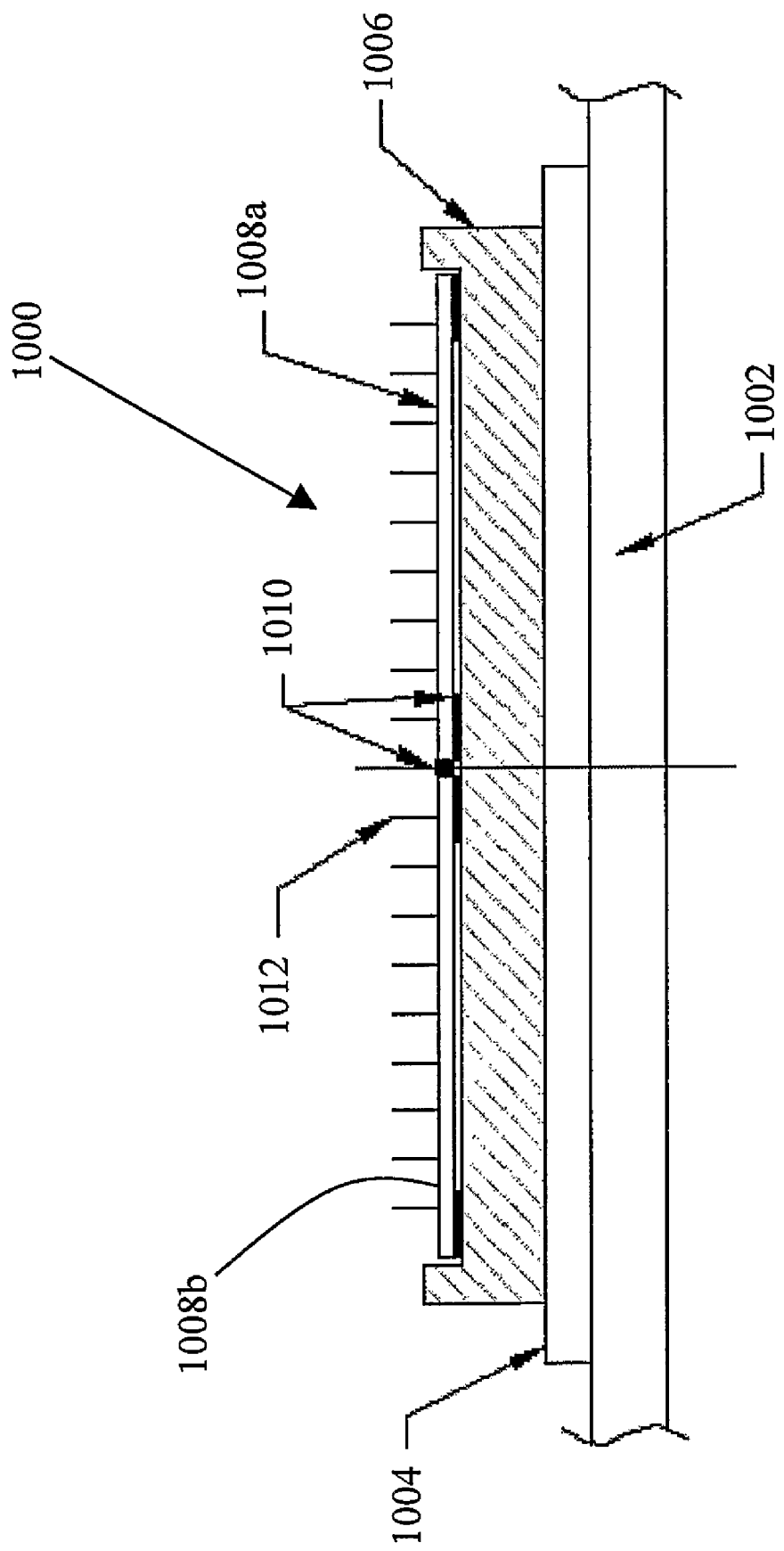
FIG. 10 is a schematic cross-sectional view of yet another probe card according to an exemplary embodiment of the present invention.

FIG. 10 illustrates probe card 1000 including PCB 1002, mounting plate 1004, and frame 1006. Frame 1006 supports substrate segments 1008a and 1008b, and substrate segments 1008a and 1008b support probe elements 1012. While not shown in FIG. 10, an interposer (e.g., a spring pin interposer, a pogo pin interposer, a planar contact array interposer, etc.) may be provided between mounting plate 1004 and substrate segments 1008a/1008b, and may comprise a number of interposers.

Epoxy 1010 is provided at various locations as shown in FIG. 10.

Figure 11:
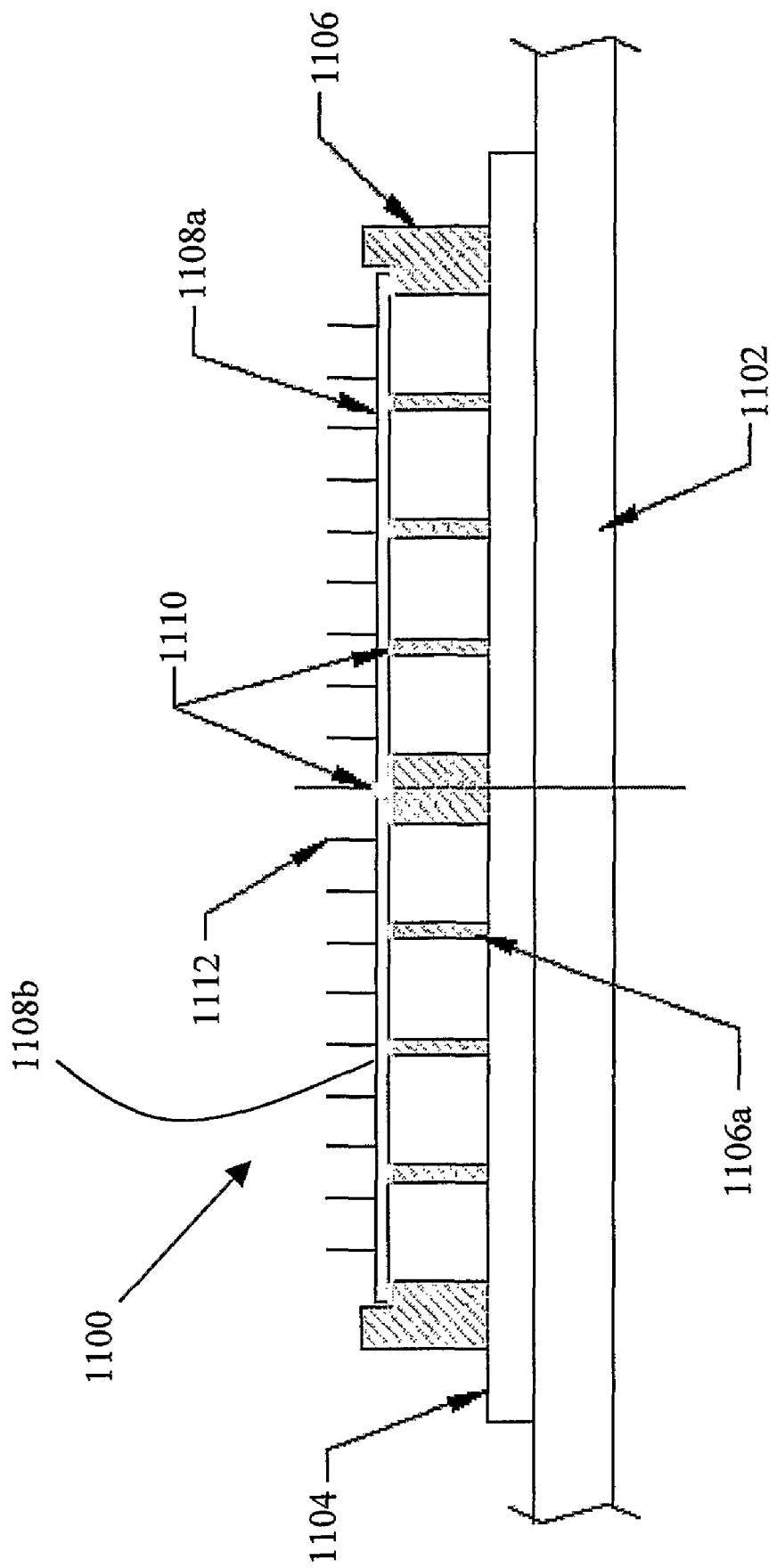
FIG. 11 is a schematic cross-sectional view of yet another probe card according to an exemplary embodiment of the present invention.

FIG. 11 illustrates probe card 1100 including PCB 1102, mounting plate 1104, and frame 1106. Frame 1006 supports substrate segments 1108a and 1108b, and substrate segments 1108a and 1108b support probe elements 1112. While not shown in FIG. 11, an interposer (e.g., a spring pin interposer, a pogo pin interposer, a planar contact array interposer, etc.) may be provided between mounting plate 1104 and substrate segments 1108a/1108b, and may comprise a number of interposers. Epoxy 1110 is provided at various locations as shown in FIG. 11.

Frame 1106 of probe card 1100 includes a number of ribs 1106a for providing additional support. For example, ribs 1106a may be configured in a linear pattern, or may be configured as a grid, as is desired.

The present invention thus provides a segmented substrate (e.g., a segmented space transformer) providing the advantages of a large substrate (e.g., improved testing efficiency) while also providing the advantages of a smaller substrate (e.g., improved manufacturability and less susceptible to effects of thermal expansion to improve accuracy of probe tip positioning).

While the present invention has been illustrated with certain simplistic probe designs illustrated herein, it is not limited thereto. Any type of probe may be used in connection with the present invention. Further, the probes may be configured in any of a number of orientations, for example, the probes may (1) extend substantially vertically with respect to the substrate surface, (2) extend along a curved or meandering path with respect to the substrate surface, (3) and/or include a beam extending substantially horizontally with respect to the substrate surface.

The teachings of the present invention may be applied to a wide array of probe card designs, for example, cantilever style probe cards, post-beam-tip style probe cards, probe cards utilizing a probe head (with probe floating therein), probe cards with plated-up probes, probe cards with pick-and-place attached probes, etc.

Certain exemplary embodiments of the present invention have been described with respect to a mounting plate. Such a mounting plate may be the PCB of a probe card assembly; however, a distinct mounting plate may also be utilized (e.g., as shown in FIGS. 8-11).

Certain exemplary embodiments of the present invention have been described with respect to a substrate to which the probes are mounted and/or which supports the probes. Exemplary substrates include multi-layer ceramic substrates and multi-layer organic substrates. While not limited thereto, the substrate may be a space transformer.

Certain exemplary embodiments of the present invention have been described with respect to compliant mechanisms such as (1) an epoxy material, and (2) spring elements; however, the present invention is not limited thereto. Any of a number of compliant mechanisms may be utilized.

Certain exemplary embodiments of the present invention have been described with respect to frames to which the substrate segments are coupled (or which support the substrate segments). Such frames may be a single structure, a number of distinct structures, or multiple structures coupled together. For example, frame 1106 illustrated in FIG. 11 may be a single structure (including ribs 1106a) (e.g., made from a unitary piece of material). Alternatively, ribs 1106a may be distinct from the remainder of frame 1106.

The present invention may be embodied in other specific forms without departing from the spirit or essential attributes thereof. Although the invention has been described and illustrated with respect to the exemplary embodiment thereof, it should be understood by those skilled in the art that the foregoing and various other changes, omissions and additions may be made therein and thereto, without parting from the spirit and scope of the present invention.

What is claimed is:

1. A probe card comprising:
    a mounting plate; and
    a plurality of substrate segments supported by the mounting plate via a frame that includes one or more biasing members for biasing each of the plurality of substrate segments into at least a first position relative to the frame and to elastically accommodate thermal expansion and contraction of each of the plurality of substrate segments relative to the frame wherein the biasing member includes an epoxy based material.

2. The probe card of claim 1, wherein the biasing member includes a spring element.

3. The probe card of claim 1, wherein the frame includes one or more notches configured to receive an edge portion of at least one of the plurality of substrate segments.

4. The probe card of claim 1 further comprising a printed circuit board, the mounting plate being positioned between the printed circuit board and the plurality of substrate segments.

5. The probe card of claim 1 wherein the mounting plate is a printed circuit board.

6. The probe card of claim 1 further comprising an interposer positioned between the mounting plate and the substrate segments.

7. The probe card of claim 1 wherein the plurality of substrate segments includes a first substrate segment and a second substrate segment, wherein a gap defined between (1) a first group of probe elements supported by the first substrate segment and (2) a second group of probe elements supported by the second substrate segment is substantially equal to another gap defined between (3) the first group of probe elements supported by the first substrate segment and (4) a third group of probe elements supported by the first substrate segment.

8. A probe card comprising:
    a mounting plate; and
    a plurality of substrate segments supported by the mounting plate via a frame that includes one or more biasing members for biasing each of the plurality of substrate segments into at least a first position relative to the frame and to elastically accommodate thermal expansion and contraction of each of the plurality of substrate segments relative to the frame wherein the frame is fabricated from a material having a coefficient of thermal expansion below about $2.510^{-6}$ inch per inch per Fahrenheit degree.

9. The probe card of claim 8, wherein the frame includes one or more notches configured to receive an edge portion of at least one of the plurality of substrate segments.

10. The probe card of claim 8, wherein the plurality of substrate segments includes a first substrate segment and a second substrate segment, wherein a gap defined between (1) a first group of probe elements supported by the first substrate segment and (2) a second group of probe elements supported by the second substrate segment is substantially equal to another gap defined between (3) the first group of probe elements supported by the first substrate segment and (4) a third group of probe elements supported by the first substrate segment.

11. A probe card comprising:
    a printed circuit board including a plurality of conductive pads; and
    a probe substrate supporting a plurality of probe elements, the probe elements being conductively coupled to respective ones of the plurality of conductive pads, the probe substrate including a plurality of substrate segments supported by the printed circuit board via a frame that includes one or more biasing members for biasing each of the plurality of substrate segments into at least a first position relative to the frame and to elastically accommodate thermal expansion and contraction of each of the plurality of substrate segments relative to the frame wherein the biasing member includes an epoxy based material.

12. The probe card of claim 11, wherein the biasing member includes a spring element.

13. The probe card of claim 11, wherein the frame includes one or more notches configured to receive an edge portion of at least one of the plurality of substrate segments.

14. The probe card of claim 11, further comprising a mounting plate positioned between the printed circuit board and the plurality of substrate segments.

15. The probe card of claim 11, further comprising an interposer positioned between the printed circuit board and the plurality of substrate segments.

16. The probe card of claim 11, wherein the plurality of substrate segments includes a first substrate segment and a second substrate segment, wherein a gap defined between (1) a first group of probe elements supported by the first substrate segment and (2) a second group of probe elements supported by the second substrate segment is substantially equal to another gap defined between (3) the first group of probe elements supported by the first substrate segment and (4) a third group of probe elements supported by the first substrate segment.

17. A probe card comprising:
    a printed circuit board including a plurality of conductive pads; and
    a probe substrate supporting a plurality of probe elements, the probe elements being conductively coupled to respective ones of the plurality of conductive pads, the probe substrate including a plurality of substrate segments supported by the printed circuit board via a frame that includes one or more biasing members for biasing each of the plurality of substrate segments into at least a first position relative to the frame and to elastically accommodate thermal expansion and contraction of each of the plurality of substrate segments relative to the frame wherein the frame is fabricated from a material having a coefficient of thermal expansion below about $2.5*10^{-6}$ inch per inch per Fahrenheit degree.

18. The probe card of claim 17, wherein the frame includes one or more notches configured to receive an edge portion of at least one of the plurality of substrate segments.

19. The probe card of claim 17, wherein the plurality of substrate segments includes a first substrate segment and a second substrate segment, wherein a gap defined between (1) a first group of probe elements supported by the first substrate segment and (2) a second group of probe elements supported by the second substrate segment is substantially equal to another gap defined between (3) the first group of probe elements supported by the first substrate segment and (4) a third group of probe elements supported by the first substrate segment.

* * * * *

UNITED STATES PATENT AND TRADEMARK OFFICE
CERTIFICATE OF CORRECTION

| | | |
|---|---|---|
| PATENT NO. | : 8,058,889 B2 | Page 1 of 1 |
| APPLICATION NO. | : 11/792331 | |
| DATED | : November 15, 2011 | |
| INVENTOR(S) | : Scott R. Williams, Bahadir Tunaboylu and Anh-Tai Thai Nguyen | |

It is certified that error appears in the above-identified patent and that said Letters Patent is hereby corrected as shown below:

TITLE PAGE

(75) Inventor: insert --Bahadir Tunaboylu, Chandler, AZ (US), Anh-Tai Thai Nguyen, Gilbert, AZ (US)-- after Scott R. Williams, Saint George, UT (US)

Signed and Sealed this
Twenty-first Day of October, 2014

Michelle K. Lee
*Deputy Director of the United States Patent and Trademark Office*